(12) United States Patent
Kim

(10) Patent No.: US 7,876,040 B2
(45) Date of Patent: *Jan. 25, 2011

(54) ACTIVE MATRIX ELECTROLUMINESCENCE DEVICE HAVING A METALLIC PROTECTIVE LAYER AND METHOD FOR FABRICATING THE SAME

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 222 days.

This patent is subject to a terminal disclaimer.

(21) Appl. No.: 11/854,700

(22) Filed: Sep. 13, 2007

(65) Prior Publication Data

US 2008/0174240 A1 Jul. 24, 2008

Related U.S. Application Data

(63) Continuation of application No. 11/656,471, filed on Jan. 23, 2007, now Pat. No. 7,755,280, which is a continuation of application No. 10/836,348, filed on May 3, 2004, now Pat. No. 7,187,122.

(30) Foreign Application Priority Data

Jun. 23, 2003 (KR) .................. 10-2003-0040712

(51) Int. Cl.
*H01J 1/62* (2006.01)
(52) U.S. Cl. .................. 313/506; 313/498; 313/500; 313/509
(58) Field of Classification Search .......... 313/498–512
See application file for complete search history.

(56) References Cited

U.S. PATENT DOCUMENTS 3,988,823 A * 11/1976 Hu .............................. 438/624
4,609,567 A * 9/1986 Toth et al. .................... 136/260
5,796,766 A 8/1998 Hargis et al. ................. 372/36
6,101,201 A 8/2000 Hargis et al. ................. 372/36
2002/0038998 A1* 4/2002 Fujita et al. ................. 313/495
2002/0097769 A1 7/2002 Vetrovec ...................... 372/75
2003/0058376 A1* 3/2003 Zhang ......................... 349/43
2003/0117083 A1 6/2003 Koyama (Continued)

FOREIGN PATENT DOCUMENTS

JP 61-502927 12/1986

(Continued)

OTHER PUBLICATIONS

Korean Office Action dated Jun. 28, 2005.

(Continued)

*Primary Examiner*—Bumsuk Won
(74) *Attorney, Agent, or Firm*—KED & Associates, LLP

(57) ABSTRACT

An electroluminescent (EL) device includes a plurality of first transistors provided over a first area of a substrate and a plurality of second transistors provided over a second area of the substrate. A plurality of light emitting elements, each including an EL layer, are coupled to corresponding ones of the first transistors, and at least one insulating layer is provided on at least one of the plurality of first transistors or the plurality of second transistors. A conductive layer having a multilayer structure is then provided over at least one of the plurality of second transistors and on the at least one insulating layer.

19 Claims, 5 Drawing Sheets

U.S. PATENT DOCUMENTS

| | | |
|---|---|---|
| 2003/0201728 A1 | 10/2003 | Miyajima et al. |
| 2003/0214248 A1 | 11/2003 | Jinno |
| 2004/0012549 A1* | 1/2004 | Nishikawa .................. 345/76 |
| 2004/0017149 A1 | 1/2004 | Matsumoto et al. |
| 2004/0080276 A1 | 4/2004 | Ito |
| 2004/0109218 A1 | 6/2004 | Kobayashi |

FOREIGN PATENT DOCUMENTS

| | | |
|---|---|---|
| JP | 01-289180 | 11/1989 |
| JP | 07-094808 | 4/1995 |
| JP | 07-211976 | 8/1995 |
| JP | 2003-332045 | 11/2003 |
| JP | 2004-085769 | 3/2004 |
| KR | 20-0257242 | 11/2001 |
| KR | 10-2003-0037451 | 5/2003 |

OTHER PUBLICATIONS

Japanese Office Action dated Mar. 17, 2009.
Chinese Office Action dated Apr. 4, 2008.
Japanese Office Action dated Apr. 14, 2010.

* cited by examiner

Light

Light

ACTIVE MATRIX ELECTROLUMINESCENCE DEVICE HAVING A METALLIC PROTECTIVE LAYER AND METHOD FOR FABRICATING THE SAME

This application is a Continuation Application of U.S. application Ser. No. 11/656,471, filed Jan. 23, 2007 now U.S. Pat. No. 7,755,280, which is a Continuation Application of U.S. application Ser. No. 10/836,348, filed May 3, 2004 now U.S. Pat. No. 7,187,122. The disclosures of the previous application is incorporated by reference herein.

BACKGROUND OF THE INVENTION

1. Field of the Invention

The present invention relates to an electroluminescence device, and more particularly, to an active matrix electroluminescence device and a method for fabricating the same. Although the present invention is suitable for a wide scope of applications, it is particularly suitable for preventing damage caused by UV light rays during the fabrication process.

2. Discussion of the Related Art

An electroluminescence device is being viewed as a next generation flat display device for its characteristics of a wide viewing angle, a high aperture ratio, and a high chromaticity. More specifically, in an organic electroluminescence (EL) device, when an electric charge is injected into an organic electroluminous (EL) layer formed between a hole injection electrode and an electron injection electrode, the electron and the hole are paired to each other generating an exciton, the excited state of which falls to a ground state, thereby emitting light. Thus, the organic electroluminescence device OLD) can be operated at a lower voltage, as compared to other display devices.

Depending upon the driving method, the organic ELD can be classified into a passivation ELD and an active matrix ELD. The passivation ELD is formed of a transparent electrode on a transparent substrate, an organic EL layer on the transparent electrode, and a cathode electrode on the organic EL layer. The active matrix ELD is formed of a plurality of scan lines and data lines defining a pixel area on a substrate, a switching device electrically connecting the scan lines and the data lines and controlling the electroluminescence device, a transparent electrode (i.e., anode) electrically connected to the switching device and formed in the pixel area on the substrate, an organic EL layer on the transparent electrode, and a metal electrode (i.e., cathode) on the organic EL layer. Unlike the passivation ELD, the active matrix ELD further includes the switching device, which is a thin film transistor (TFT).

However, in the related art fabricating method, UV light rays are used to carry out a surface treatment process both prior to and after forming the organic EL layer. During the process, the UV light rays cause damages on devices, such as the thin film transistor. More specifically, such damages mainly occur in devices that are not in the emissive area, such as a gate driver or a data driver.

SUMMARY OF THE INVENTION

Accordingly, the present invention is directed to an active matrix electroluminescence device and a method for fabricating the same that substantially obviate one or more problems due to limitations and disadvantages of the related art.

An object of the present invention is to provide an active matrix electroluminescence device and a method for fabricating the same, which can enhance the reliability of the device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an active matrix electroluminescence display device includes a plurality of transistors formed on a substrate having an emissive area and a non-emissive area defined thereon, an insulating layer formed on the substrate and the thin film transistors, a metallic protective layer formed on the insulating layer of the non-emissive area, a first electrode formed on the insulating layer of the emissive area, an electroluminous layer formed on the first electrode, and a second electrode formed on the electroluminous layer.

Herein, the metallic protective layer is formed either on an entire surface or a predetermined area of the insulating layer of the non-emissive area. When the metallic protective layer and the first electrode are formed of the same material, the metallic protective layer and the first electrode are formed of an opaque metal. Conversely, when the metallic protective layer and the first electrode are formed of a different material, the metallic protective layer is formed of an opaque metal, and the first electrode is formed of a transparent metal.

In order to prevent a capacitance with the thin film transistors from occurring, the metallic protective layer is electrically connected to one of a gate pad and a data pad.

In another aspect of the present invention, a method for fabricating an active matrix electroluminescence display device includes forming a plurality of transistors on a substrate having an emissive area and a non-emissive area defined thereon, forming an insulating layer on the substrate and the thin film transistors, forming a metallic protective layer on the insulating layer of the non-emissive area, and forming a first electrode on the insulating layer of the emissive area, forming an electroluminous layer on the first electrode, and forming a second electrode on the electroluminous layer.

Herein, a metallic material layer is formed on an entire surface of the insulating layer, the metallic material layer then being selectively removed, so as to simultaneously form the first electrode and the metallic protective layer. Or, by using different materials, the first electrode and the metallic protective layer are formed non-simultaneously.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First Embodiment

Figure 1A:
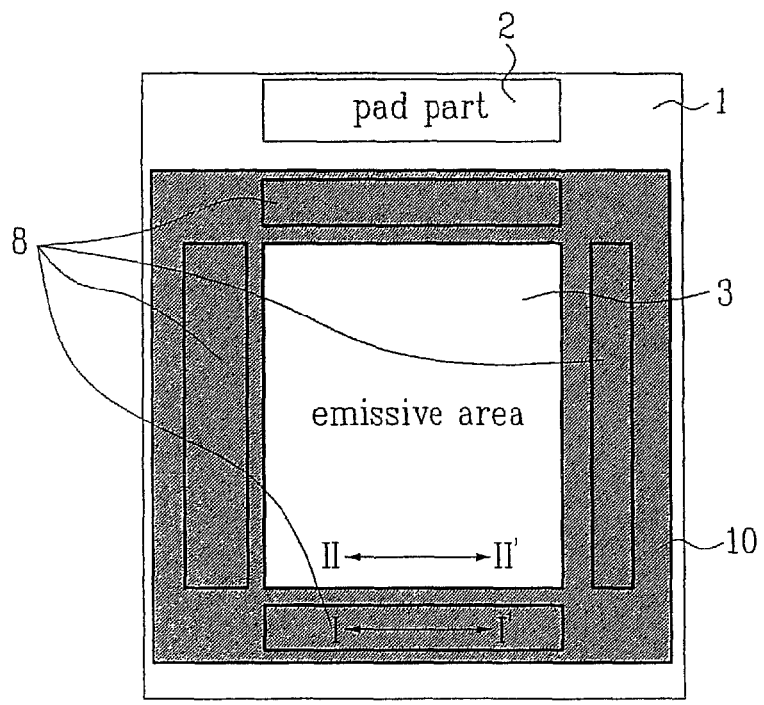
FIGS. 1A to 1C illustrate a plane view and cross-sectional views of an active matrix electroluminescence device according to a first embodiment of the present invention.
Figure 1B:
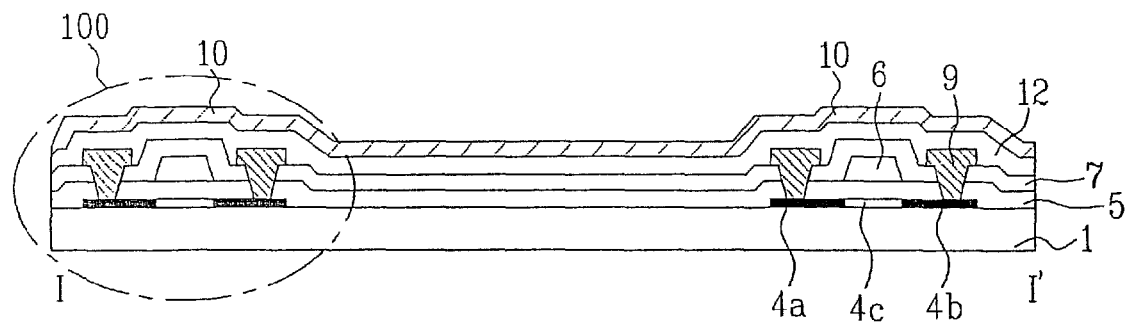
Figure 1C:
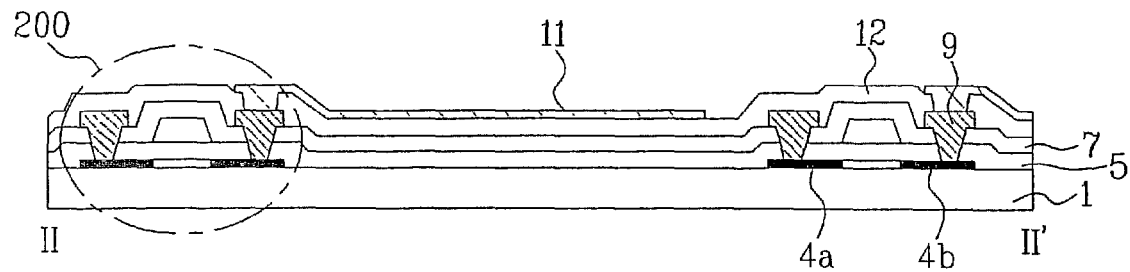

FIGS. 1A to 1C illustrate a plane view and cross-sectional views of an active matrix electroluminescence device according to a first embodiment of the present invention.

Referring to FIG. 1A, a pad part 2, an emissive area 3, and a circuit part 8 are formed on a substrate 1. Herein, the pad part 2 is formed of a gate pad, a data pad, and so on, and the emissive area 3 is formed of a plurality of pixels. In addition, the circuit part 8 is formed on a non-emissive area as a gate driver or a data driver.

In addition, the active matrix electroluminescence device according to the first embodiment of the present invention also includes a metallic protective layer 10 formed on the circuit part 8 outside of the emissive area 3, so as to prevent damages caused by the UV light rays from occurring in the circuit part 8. The metallic protective layer 10 is formed on the area excluding the pad part 2 and the emissive area 3 of the substrate 1.

The method for fabricating the active matrix electroluminescence device according to the first embodiment of the present invention will now be described in detail.

Referring to FIGS. 1B and 1C, a plurality of thin film transistors 100 and 200 are formed on a glass substrate 1. The thin film transistor 200 formed within the emissive area 3 acts as a switch for controlling each pixel, and the thin film transistor 100 formed outside of the emissive area 3 acts as a gate driver or a data driver. Herein, the thin film transistors 100 and 200 are formed of source and drain electrodes 4a and 4b, a channel area 4c, a gate insulating layer 5, and a gate electrode 6.

Thereafter, an interlayer dielectric 7 is formed on the gate insulating layer 5 and the gate electrode 6. Then, the interlayer dielectric 7 and the gate insulating layer 5 are selectively etched, so as to expose a predetermined portion of the surface of the source and drain electrodes 4a and 4b, thereby forming a plurality of contact holes. The contact holes are then filled with a metal, thereby forming a plurality of electrode lines 9 each electrically connected to the source and drain electrodes 4a and 4b.

Subsequently, an insulating material (e.g., a $SiN_x$ group or $SiO_x$ group material) is deposited on the interlayer dielectric 7 and the electrode lines 9, thereby forming a protective layer 12. And, as shown in FIG. 1A, the metallic protective layer 10 is formed on an area excluding the pad part 2 and the emissive area 3. In other words, the metallic protective layer 10 is formed on the periphery of the emissive area 3. There is a plurality of methods for selectively forming the metallic protective layer 10. For example, a metal layer is formed on the entire surface of the protective layer 12, and then, the metallic protective layer 10 may be formed by selectively removing the metal layer on the emissive area 3 and the pad part 2. The metallic protective layer 10 may also be selectively deposited on the protective layer 12 by using a mask. Herein, the metallic protective layer 10 is formed of one of or an alloy of chrome (Cr), copper (Cu), tungsten (W), gold (Au), nickel (Ni), silver (Ag), titanium (Ti), and tantalum (Ta).

Also, in order to reduce the capacitance occurring between the metallic protective layer 10 and the thin film transistor 100, the metallic protective layer 10 is electrically connected to the pad part 2 through a lining.

Moreover, referring to FIG. 1C, the protective layer 12 is selectively removed, so as to expose the electrode line 9 connected to the drain electrode 4b within the emissive area 3. Herein, contact holes are formed in the area where the protective layer 12 is selectively removed. Subsequently, a metal is deposited on the entire surface of the protective layer 12, so as to form a pixel electrode 11. In the bottom-emission electroluminescence device, the pixel electrode 11 is formed of a transparent material, such as indium-tin-oxide (ITO). Conversely, in the top-emission electroluminescence device, the pixel electrode 11 is formed of a metal having high reflectivity and work function. The pixel electrode 11 is formed only in the pixel area within the emissive area and is connected to the electrode line 9 within the emissive area. Herein, the pixel electrode 11 is formed either before forming the metallic protective layer 10, or after forming the metallic protective layer 10.

Figure 5A:
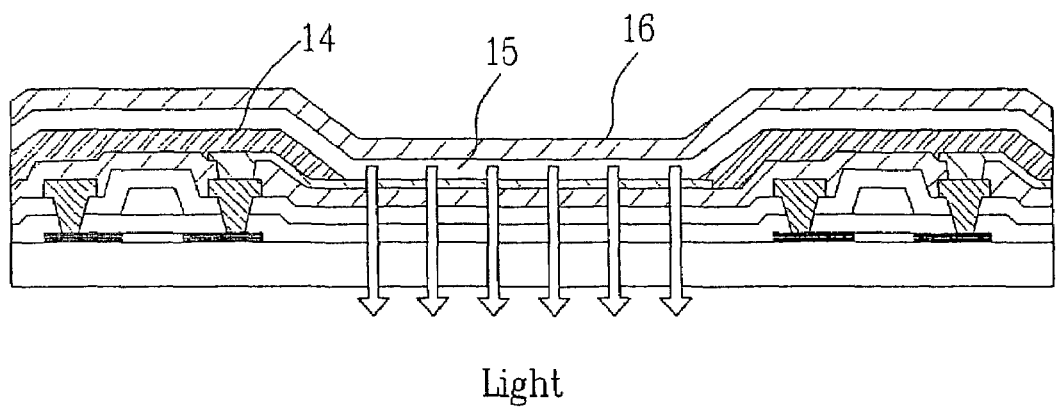
FIGS. 5A and 5B illustrate cross-sectional views of the active matrix electroluminescence device according to the present invention.

Thereafter, as shown in FIG. 5A, after depositing an insulating material on the entire surface of the pixel electrode 11 and the protective layer 12, the insulating material layer is selectively removed, so as to form an insulating layer 14 on the area excluding the pixel area, which is the boundary area between each pixel area. The insulating layer 14 is formed above the thin film transistor 200 of the emissive area. Subsequently, an organic electroluminous (EL) layer 15 is formed on the pixel electrode 11 by using a shadow mask (not shown), and a common electrode 16 is formed on the organic EL layer 15 and the insulating layer 14.

Although not shown in the drawings, a protective layer (not shown) is formed to protect the organic EL layer 15 from oxygen or moisture. Finally, a protective cap is formed by using a sealant and a transparent substrate.

Second Embodiment

Figure 2A:
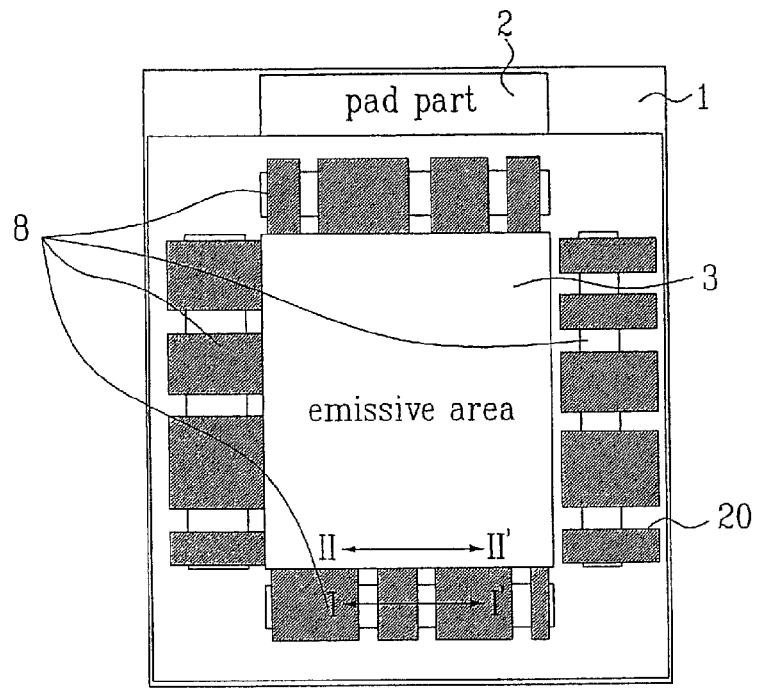
FIGS. 2A to 2C illustrate a plane view and cross-sectional views of the active matrix electroluminescence device according to a second embodiment of the present invention.
Figure 2B:
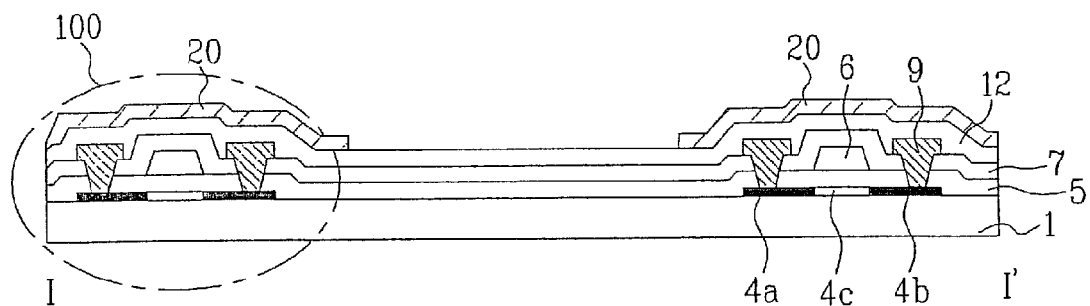
Figure 2C:
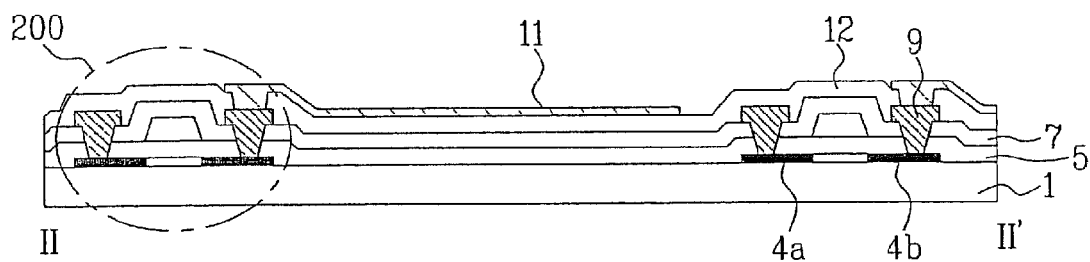

FIGS. 2A to 2C illustrate a plane view and cross-sectional views of the active matrix electroluminescence device according to a second embodiment of the present invention.

Referring to FIG. 2A, a pad part 2, an emissive area 3, and a circuit part 8 are formed on a substrate 1.

In addition, the active matrix electroluminescence device according to the second embodiment of the present invention also includes a metallic protective layer 20 formed on the circuit part 8 outside of the emissive area 3, so as to prevent damages caused by the UV light rays from occurring in the circuit part 8. Referring to FIG. 2B, the metallic protective layer 20 is selectively formed only on the devices, such as the thin film transistor 100, which are formed outside of the emissive area 3.

With the exception of the metallic protective layer 20, the structure of the second embodiment is the same as that of the first embodiment.

Third Embodiment

Figure 3A:
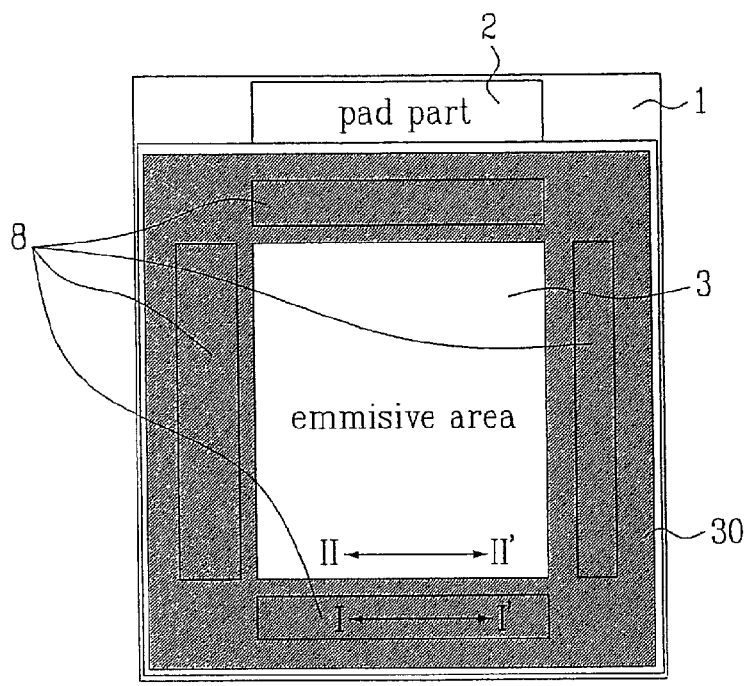
FIGS. 3A to 3C illustrate a plane view and cross-sectional views of an active matrix electroluminescence device according to a third embodiment of the present invention.
Figure 3B:
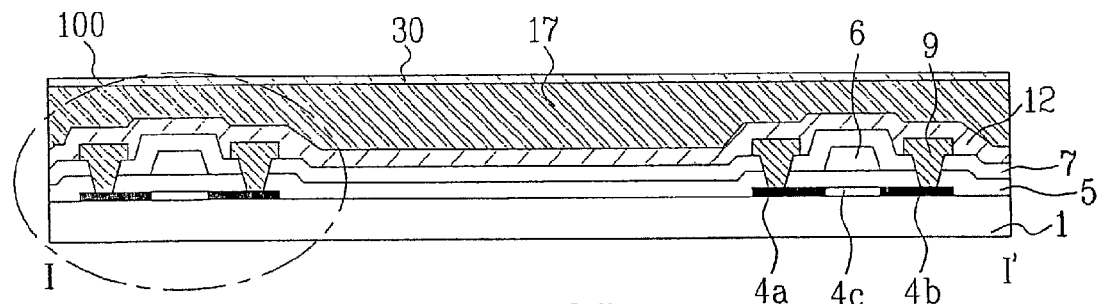
Figure 3C:
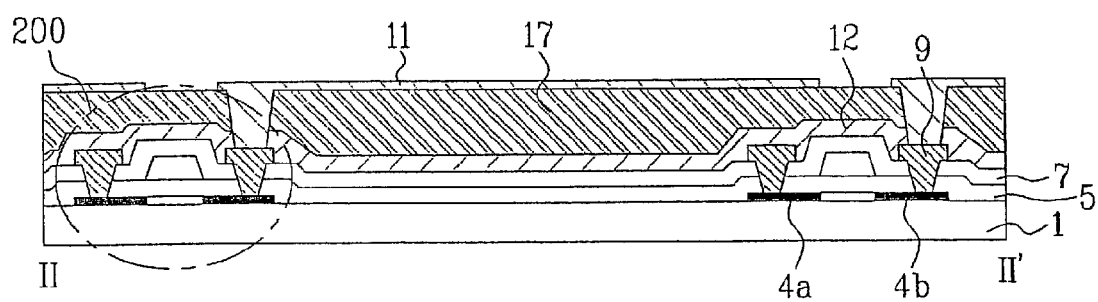

FIGS. 3A to 3C illustrate a plane view and cross-sectional views of an active matrix electroluminescence device according to a third embodiment of the present invention.

Referring to FIG. 3A, a pad part 2, an emissive area 3, and a circuit part 8 are formed on a substrate 1.

In addition, the active matrix electroluminescence device according to the third embodiment of the present invention also includes a metallic protective layer 30 formed on the circuit part 8 outside of the emissive area 3, so as to prevent damages caused by the UV light rays from occurring in the circuit part 8. Herein, the metallic protective layer 30 is formed only on a region outside of the pad part 2 and the emissive area 3.

The method for fabricating the active matrix electroluminescence device according to the third embodiment of the present invention will now be described.

Referring to FIGS. 3B and 3C, a plurality of thin film transistors 100 and 200 is formed on the glass substrate 41. The thin film transistor 200 formed within the emissive area 3 acts as a switch for controlling each pixel, and the thin film transistor 100 formed outside of the emissive area 3 acts as a gate driver or a data driver. Herein, the thin film transistors 100 and 200 are formed of source and drain electrodes 4a and 4b, a channel area 4c, a gate insulating layer 5, and a gate electrode 6.

Thereafter, an interlayer dielectric 7 is formed on the gate insulating layer 5 and the gate electrode 6. Then, the interlayer dielectric 7 and the gate insulating layer 5 are selectively etched, so as to expose a predetermined portion of the surface of the source and drain electrodes 4a and 4b, thereby forming a plurality of contact holes. The contact holes are then filled with a metal, thereby forming a plurality of electrode lines 9 each electrically connected to the source and drain electrodes 4a and 4b.

Then, an insulating material (e.g., a $SiN_x$ group or $SiO_x$ group material) is deposited on the interlayer dielectric 7 and the electrode lines 9, thereby forming a protective layer 12. Then, a planarization overcoat 17 is formed on the protective layer 12.

Subsequently, a metallic material layer is deposited on the planarization overcoat 17, and the metallic material layer is selectively removed, so as to simultaneously form the pixel electrode 11 and the metallic protective layer 30 of the same material. The pixel electrode 11 is formed only on the pixel area within the emissive area 3 and is connected to the electrode line 7 within the emissive area 3. The metallic protective layer 30 is formed in the area excluding the emissive area 3 and the pad part 2, as shown in FIG. 3A. More specifically, the metallic protective layer 30 is formed on the periphery of the emissive area 3. Herein, the pixel electrode 11 and the metallic protective layer 30 are formed of one of, an alloy of or a multi-layer of, chrome (Cr), copper (Cu), tungsten (W), gold (Au), nickel (Ni), silver (Ag), titanium (Ti), and tantalum (Ta).

Also, in order to reduce the capacitance occurring between the metallic protective layer 30 and the thin film transistor 100, the metallic protective layer 30 is electrically connected to the pad part 2 through a lining.

Figure 5B:
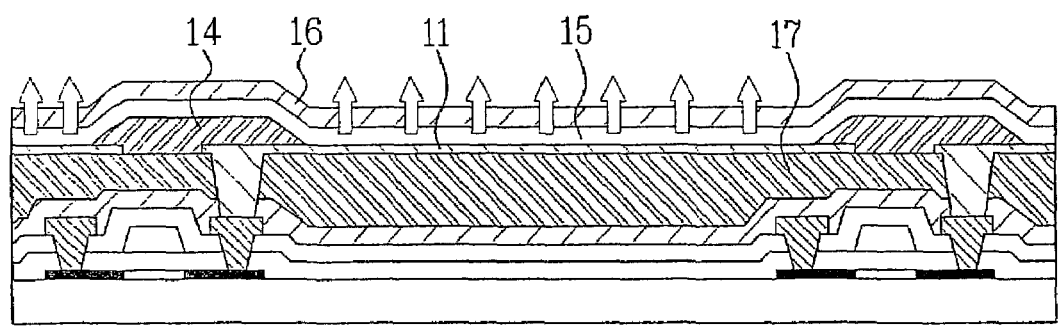

Furthermore, as shown in FIG. 5B, after depositing an insulating material on the entire surface of the pixel electrode 11 and the planarization overcoat 17, the insulating material layer is selectively removed, so as to form an insulating layer 14 on the area excluding the pixel area, which is the boundary area between each pixel area. Subsequently, an organic electroluminous (EL) layer 15 is formed on the pixel electrode 11 by using a shadow mask (not shown), and a common electrode 16 is formed on the organic EL layer 15 and the insulating layer 14.

Fourth Embodiment

Figure 4A:
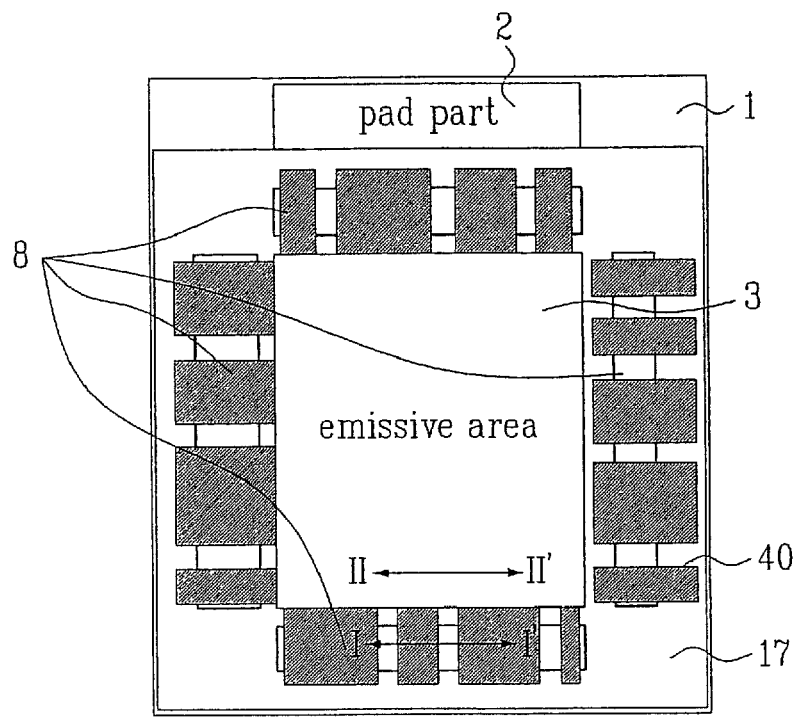
FIGS. 4A to 4C illustrate a plane view and cross-sectional views of an active matrix electroluminescence device according to a fourth embodiment of the present invention.
Figure 4B:
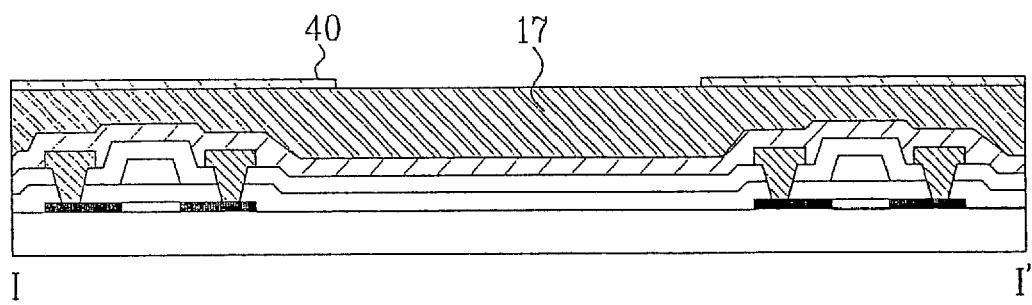
Figure 4C:
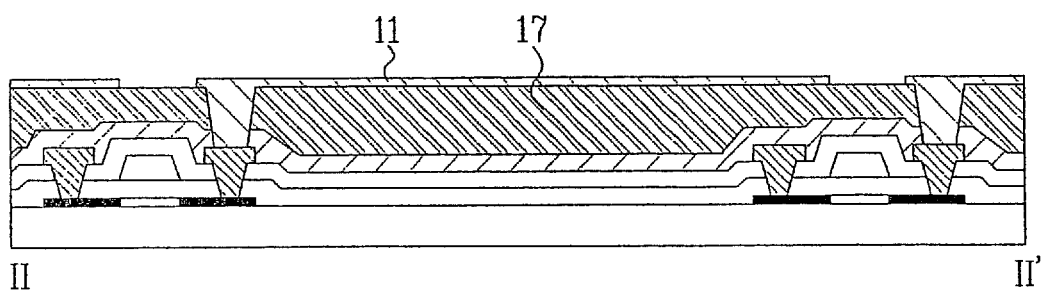

FIGS. 4A to 4C illustrate a plane view and cross-sectional views of an active matrix electroluminescence device according to a fourth embodiment of the present invention.

Referring to FIG. 4A, a pad part 2, an emissive area 3, and a circuit part 8 are formed on a substrate 1.

In addition, the active matrix electroluminescence device according to the fourth embodiment of the present invention also includes a metallic protective layer 40 formed on the circuit part 8 outside of the emissive area 3, so as to prevent damages caused by the UV light rays from occurring in the circuit part 8. Referring to FIG. 4B, the metallic protective layer 40 is selectively formed only on the devices, such as the thin film transistor 100, which are formed outside of the emissive area 3. Herein, the metallic protective layer 40 is formed of the same material as that of the pixel electrode 11.

With the exception of the metallic protective layer 40, the structure of the fourth embodiment is the same as that of the third embodiment.

In the aforementioned active matrix electroluminescence display device and the method for fabricating the same, the metallic protective layer is formed on devices outside of the emissive area, such as the thin film transistor, so as to prevent damage caused by the UV light rays from occurring during the fabrication process, thereby providing a highly reliable device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An electroluminescent (EL) device comprising:
   a substrate having a first area and a second area, wherein the first area is included in an emissive area and the second area is included in a non-emissive area;
   a plurality of first transistors provided over the first area of the substrate, at least one of the plurality of first transistors having a first source, a first drain, a channel provided between the first source and drain, and a first gate provided over the channel;
   a plurality of light emitting elements, each of the plurality of light emitting elements coupled to a corresponding transistor of the plurality of first transistors, at least one of the plurality of light emitting elements having a first electrode, a second electrode and an electroluminescent layer provided between the first and second electrodes, and the first electrode is coupled to the first drain of a corresponding transistor of the plurality of first transistors;
   a plurality of second transistors provided over the second area of the substrate, at least one of the plurality of second transistors having a second source, a second drain, a channel provided between the second source and drain, and a second gate provided over the channel;
   at least one insulating layer provide on at least one of the plurality of first transistors or the plurality of second transistors;
   a first protective layer over at least one of the plurality of second transistors; and a second protective layer including a conductive layer over the first protective layer and the at least one of the plurality of second transistors, wherein the first and second protective layers are formed from one or more materials that block ultraviolet rays, and wherein the second source, the second drain, the channel provided between the second source and drain, and the second gate at the plurality of second transistors are covered with the conductive layer.

2. The electroluminescent (EL) device of claim 1, wherein the conductive layer is coupled to a pad.

3. The electroluminescent (EL) device of claim 1, wherein the conductive layer and the first electrode of the at least one light emitting element are formed on a substantially same plane.

4. The electroluminescent (EL) device of claim 1, wherein at least a portion of the conductive layer is provide on a different plane from at least a portion of the first electrode of the at least one light emitting element.

5. The electroluminescent (EL) device of claim 1, wherein the electroluminescent (EL) layer generates light, which substantially passes through the first electrode.

6. The electroluminescent (EL) device of claim 1, wherein the electroluminescent (EL) layer generates light, which substantially passes through the second electrode.

7. The electroluminescent (EL) device of claim 1, wherein the conductive layer is one at least one of chrome (Cr), copper (Cu), tungsten (W), gold (Au), nickel (Ni), silver (Ag), titanium (Ti), tantalum (Ta) or alloy thereof.

8. The electroluminescent (EL) device of claim 1 or 7, wherein the first electrode includes at least a layer of indium tin oxide (ITO).

9. The electroluminescent (EL) device of claim 1, further comprising:

a planarization layer formed between the conductive layer and said at least one of the second plurality of transistors, the conductive layer formed directly on an upper surface of the planarization layer so that the conductive layer has a substantially uniform planar thickness in the non-emissive area.

10. The electroluminescent (EL) device of claim 9, wherein the conductive layer is formed over all of said plurality of second transistors in the non-emissive area.

11. The electroluminescent (EL) device of claim 10, wherein the conductive layer is continuously formed throughout all of the non-emissive area having said substantially uniform planar thickness.

12. The electroluminescent (EL) device of claim 10, wherein the conductive layer includes a first layer portion formed over a first one of the second plurality of transistors and a second layer portion formed over a second one of the second plurality of transistors, and wherein the conductive layer is not formed in an area between the first and second plurality of second transistors in the non-emissive area.

13. The electroluminescent (EL) device of claim 1, wherein the first protective layer is formed on the second protective layer and wherein the second protective layer is formed on the at least one insulating layer.

14. The electroluminescent (EL) device of claim 1, wherein the circuit elements are transistors.

15. An electroluminescent (EL) device comprising:

a substrate having a first area and a second area, wherein the first area is included in an emissive area and the second area is included in a non-emissive area;

a plurality of first transistors provided over the first area of the substrate, at least one of the plurality of first transistors having a first source, a first drain, a channel provided between the first source and drain, and a first gate provided over the channel;

a plurality of light emitting elements, each of the plurality of light emitting elements coupled to a corresponding transistor of the plurality of first transistors, at least one of the plurality of light emitting elements having a first electrode, a second electrode and an electroluminescent layer provided between the first and second electrodes, and the first electrode is coupled to the first drain of a corresponding transistor of the plurality of first transistors;

a plurality of second transistors provided over the second area of the substrate, at least one of the plurality of second transistors having a second source, a second drain, a channel provided between the second source and drain, and a second gate provided over the channel;

at least one insulating layer provide on at least one of the plurality of first transistors or the plurality of second transistors; and a conductive layer provided over at least one of the plurality of second transistors and on the at least one insulating layer, the conductive layer having a multilayer structure, wherein the second source the second drain the channel provided between the second source and drain, and the second gate at the plurality of second transistors are covered with the conductive layer, wherein the conductive layer includes a first layer portion that overlaps a first one of the plurality of second transistors in the non-emissive area and overlaps a second one of the plurality of second transistors in the non-emissive area, and wherein the first layer portion of the conductive layer is not formed in an area located between the first and second ones of the second plurality of transistors in the non-emissive area.

16. An electroluminescent (EL) device comprising:

a substrate having a first area and a second area, wherein the first area is included in an emissive area and the second area is included in a non-emissive area;

a plurality of light emitting elements over the first area of the substrate;

a plurality of circuit elements over the second area of the substrate; and at least one protective layer over the circuit elements, wherein:

the protective layer is formed of a material that block ultraviolet rays, and the protective layer includes a first layer portion that overlaps a first one of the circuit elements in the non-emissive area and overlaps a second of the circuit elements in the non-emissive area, and the first layer portion of the protective layer is not formed in an area located between the first and second ones of the circuit elements in the non-emissive area.

17. The electroluminescent (EL) device of claim 16, wherein the protective layer is a conductive metal layer.

18. The electroluminescent (EL) device of claim 17, further comprising:

another protective layer formed between the metal conductive layer and the first and second ones of the circuit elements.

19. The electroluminescent (EL) device of claim 18, wherein said another protective layer extends continuously between the first and second ones of the circuit elements.

* * * * *